(12) United States Patent
Wei et al.

(10) Patent No.: US 8,906,726 B2
(45) Date of Patent: Dec. 9, 2014

(54) METHOD FOR MAKING LIGHT EMITTING DIODE

(71) Applicants: Tsinghua University, Beijing (CN); Hon Hai Precision Industry Co., Ltd., New Taipei (TW)

(72) Inventors: Yang Wei, Beijing (CN); Shou-Shan Fan, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/902,958

(22) Filed: May 27, 2013

(65) Prior Publication Data

US 2013/0260487 A1    Oct. 3, 2013

Related U.S. Application Data

(63) Continuation of application No. 13/288,213, filed on Nov. 3, 2011, now Pat. No. 8,476,094.

(30) Foreign Application Priority Data

Apr. 29, 2011   (CN) .................. 2011 1 01107286

(51) Int. Cl.
    *H01L 33/62* (2010.01)
(52) U.S. Cl.
    USPC .................. 438/42; 438/22; 438/48; 438/50; 438/33.012
(58) Field of Classification Search
    CPC ............. H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742
    USPC ........ 438/22, 42, 48, E33.012; 977/950, 842; 257/81, 84, 88–89, 98–100, 347–348, 257/433–434
    See application file for complete search history.

(56) References Cited

U.S. PATENT DOCUMENTS

2008/0315183 A1    12/2008   Kinoshita et al.
(Continued)

FOREIGN PATENT DOCUMENTS

| CN | 101378104 | 3/2009 |
|----|-----------|--------|
| JP | 2003-243316 | 8/2003 |

(Continued)

*Primary Examiner* — Dung A. Le
(74) *Attorney, Agent, or Firm* — Novak Druce Connolly Bove + Quigg LLP

(57) ABSTRACT

A method for making light emitting diode, the method includes the following steps. First, a substrate having an epitaxial growth surface is provided. Second, a carbon nanotube layer is suspended above the epitaxial growth surface. Third, a first semiconductor layer, an active layer and a second semiconductor layer are grown on the epitaxial growth surface in that order, wherein the first semiconductor layer includes a buffer layer, an intrinsic semiconductor layer, and a doped semiconductor layer stacked in that order. Fourth, the doped semiconductor layer is exposed by removing the substrate, the buffer layer, and the intrinsic semiconductor layer. Fifth, a first electrode is prepared on the first semiconductor layer and a second electrode is prepared on the second semiconductor layer.

17 Claims, 14 Drawing Sheets

(56) References Cited

U.S. PATENT DOCUMENTS

| | | | |
|---|---|---|---|
| 2009/0050909 A1* | 2/2009 | Chen et al. | 257/88 |
| 2009/0224272 A1* | 9/2009 | Yu et al. | 257/98 |
| 2011/0026758 A1 | 2/2011 | Wang et al. | |
| 2011/0053302 A1* | 3/2011 | Kim et al. | 438/46 |
| 2012/0009115 A1 | 1/2012 | Grigorian et al. | |

FOREIGN PATENT DOCUMENTS

| | | |
|---|---|---|
| JP | 2009-177212 | 8/2009 |
| JP | 2009-242145 | 10/2009 |
| JP | 2010-232464 | 10/2010 |
| JP | 2011-35903 | 2/2011 |
| WO | WO2010102250 | 9/2010 |

\* cited by examiner

METHOD FOR MAKING LIGHT EMITTING DIODE

CROSS-REFERENCE TO RELATED APPLICATIONS

This application is a continuation of U.S. patent application Ser. No. 13/288,213, filed on Nov. 3, 2011, entitled, "METHOD FOR MAKING LIGHT EMITTING DIODE," which claims all benefits accruing under 35 U.S.C. §119 from China Patent Application No. 201110110728.6, filed on Apr. 29, 2011 in the China Intellectual Property Office. The disclosures of the above-identified applications are incorporated herein by reference.

BACKGROUND

1. Technical Field

The present disclosure relates to a light emitting diode (LED) and method for making the same.

2. Description of Related Art

In recent years, highly efficient LEDs made with GaN-based semiconductors have become widely used in different technologies, such as in display devices, large electronic bill boards, street lights, car lights, and other illumination applications. LEDs are environmentally friendly, long working life, and low power consumption.

A conventional LED commonly includes an N-type semiconductor layer, a P-type semiconductor layer, an active layer, an N-type electrode, and a P-type electrode. The active layer is located between the N-type semiconductor layer and the P-type semiconductor layer. The P-type electrode is located on the P-type semiconductor layer. The N-type electrode is located on the N-type semiconductor layer. Typically, the P-type electrode is transparent. In operation, a positive voltage and a negative voltage are applied respectively to the P-type semiconductor layer and the N-type semiconductor layer. Thus, cavities in the P-type semiconductor layer and electrons in the N-type semiconductor layer can enter the active layer and combine with each other to emit visible light.

However, extraction efficiency of LEDs is low for the following reasons: first, the typical semiconductor materials have a higher refraction index than that of air, therefore, large-angle lights emitted from the active layer may be internally reflected in LEDs, so that a large portion of the lights emitted from the active layer will remain in the LEDs; second, the current is limited under the P-type electrode, so that the conduction of the current along a direction away from the P-type electrode is weaken, thus the lights emitted from the active layer is reduced. The extraction efficiency of LEDs is low so that the heat produced in the LEDs is remained in the inner of the LED. Therefore, the property of the semiconductor materials is damaged and the life span of the LED is shorter. As a result, the large-scale application of the LEDs is affected.

What is needed, therefore, is a LED and a method for making the same, which can overcome the above-described shortcomings

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
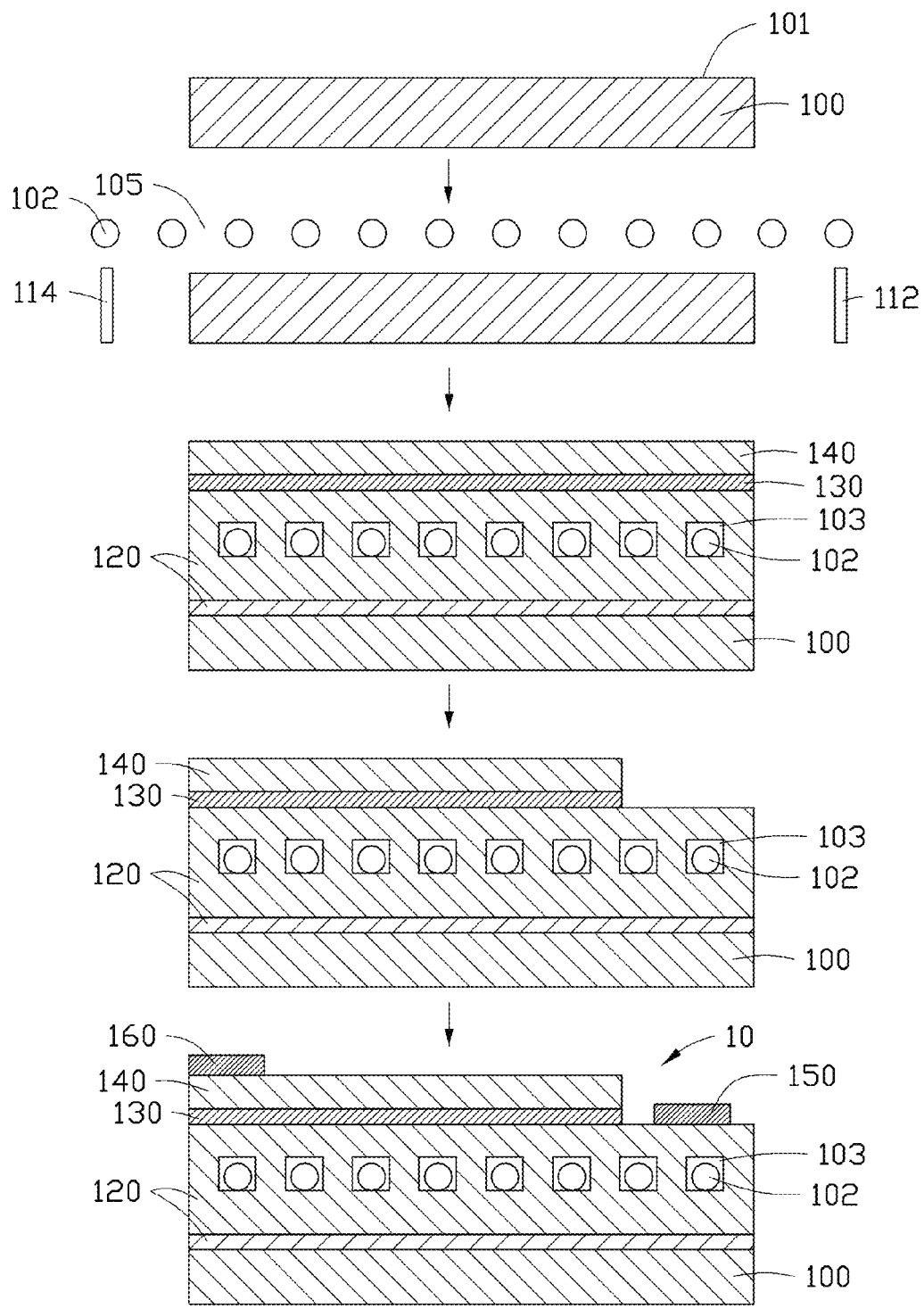
FIG. 1 is a flowchart of one embodiment of a method for making an LED.

Referring to FIG. 1, a method for making an LED of one embodiment includes the following steps:

S11, providing a substrate 100 having an epitaxial growth surface 101;

S12, suspending a carbon nanotube layer 102 above the epitaxial growth surface 101; and S13, growing a first semiconductor layer 120, an active layer 130, and a second semiconductor layer 140 on the epitaxial growth surface 101 in that order, in which the carbon nanotube layer 102 is enclosed in the first semiconductor layer 120;

S14, etching a portion of the second semiconductor layer 140 and the active layer 130 to expose a portion of the first semiconductor layer 120; and S15, preparing a first electrode 150 on the first semiconductor layer 120 and preparing a second electrode 160 on the second semiconductor layer 140.

In step S11, the epitaxial growth surface 101 can be used to grow the first semiconductor layer 120. The epitaxial growth surface 101 is a clean and smooth surface. The substrate 100 can be made of transparent material. The substrate 100 is used to support the first semiconductor layer 120. The substrate 100 can be a single-layer structure or a multi-layered structure. If the substrate 100 is a single-layer structure, the substrate 100 can be a single crystal structure having a crystal face. The crystal face can be used as the epitaxial growth surface 101. If the substrate 100 is the single-crystal structure, the material of the substrate 100 can be made of SOI (silicon on insulator), $LiGaO_2$, $LiAlO_2$, $Al_2O_3$, Si, GaAs, GaN, GaSb, InN, InP, InAs, InSb, AlP, AlAs, AlSb, AlN, SiC, SiGe, GaMnAs, GaAlAs, GaInAs, GaAlN, GaInN, AlInN, GaAsP, InGaN, AlGaInN, or AlGaInP. If the substrate 100 is a multi-layer structure, the substrate 100 should include at least one layer of the above-described single crystal structure having a crystal face. The material of the substrate 100 can be selected according to the material of the first semiconductor layer 120 which will be grown on the substrate 100 in step S30. The size, thickness, and shape of the substrate 100 can be selected according to need. In one embodiment, the substrate 100 is made of sapphire.

In step S12, the carbon nanotube layer 102 includes a number of carbon nanotubes. A thickness of the carbon nanotube layer 102 is in a range from 1 nm to 100 μm, for example the thickness can be about 1 nm, 10 nm, 200 nm, 1 μm, or 10 μm. In one embodiment, the thickness of the carbon nanotube layer 102 is about 100 nm. The length and diameter of the carbon nanotubes in the carbon nanotube layer 102 are selected according to need. The carbon nanotubes in the carbon nanotube layer 102 can be single-walled, double-walled, multi-walled carbon nanotubes, or combinations thereof.

The carbon nanotube layer 102 forms a pattern so part of the epitaxial growth surface 101 can be exposed from the patterned carbon nanotube layer 102 after the carbon nanotube layer 102 is placed on the epitaxial growth surface 101. Thus, the first semiconductor layer 120 can grow from the exposed epitaxial growth surface 101.

The patterned carbon nanotube layer 102 defines a number of apertures 105. The apertures 105 are dispersed uniformly. The apertures 105 extend through the carbon nanotube layer 102 along a thickness direction of the carbon nanotube layer 102. Therefore, the carbon nanotube layer 102 is a graphical structure. The carbon nanotube layer 102 covers the epitaxial growth surface 101 of the substrate 100. A portion of the epitaxial growth surface 101 is then exposed from the apertures 105 of the carbon nanotube layer 102, and the first semiconductor layer 120 grows from the apertures 105 of the carbon nanotube layer 102 in step S13. The apertures 105 can be a hole defined by several adjacent carbon nanotubes or a gap defined by two substantially parallel carbon nanotubes and extending along axial direction of the carbon nanotubes. The size of the apertures 105 can be the diameter of the hole or width of the gap, and can be in a range from about 10 nm to about 500 μm. The hole-shaped apertures 105 and the gap shaped apertures 105 can exist in the patterned carbon nanotube layer 102 at the same time. The sizes of the apertures 105 can be different. The sizes of the apertures 105 can be in a range from about 10 nm to about 300 μm, for example the sizes can be about 50 nm, 100 nm, 500 nm, 1 μm, 10 μm, 80 μm, or 120 μm. The smaller the sizes of the apertures 105, the less dislocation defects will occur during the growth of the first semiconductor layer 120. In one embodiment, the sizes of the apertures 105 are in a range from about 10 nm to about 10 μm. The duty factor of the carbon nanotube layer 102 is an area ratio between the sheltered epitaxial growth surface 101 and the exposed epitaxial growth surface 101. The duty factor of the carbon nanotube layer 102 can be in a range from about 1:100 to about 100:1, such as about, 1:10, 1:2, 1:4, 4:1, 2:1, or 10:1. In one embodiment, the duty factor of the carbon nanotube layer 102 is in a range from about 1:4 to about 4:1.

Figure 2:
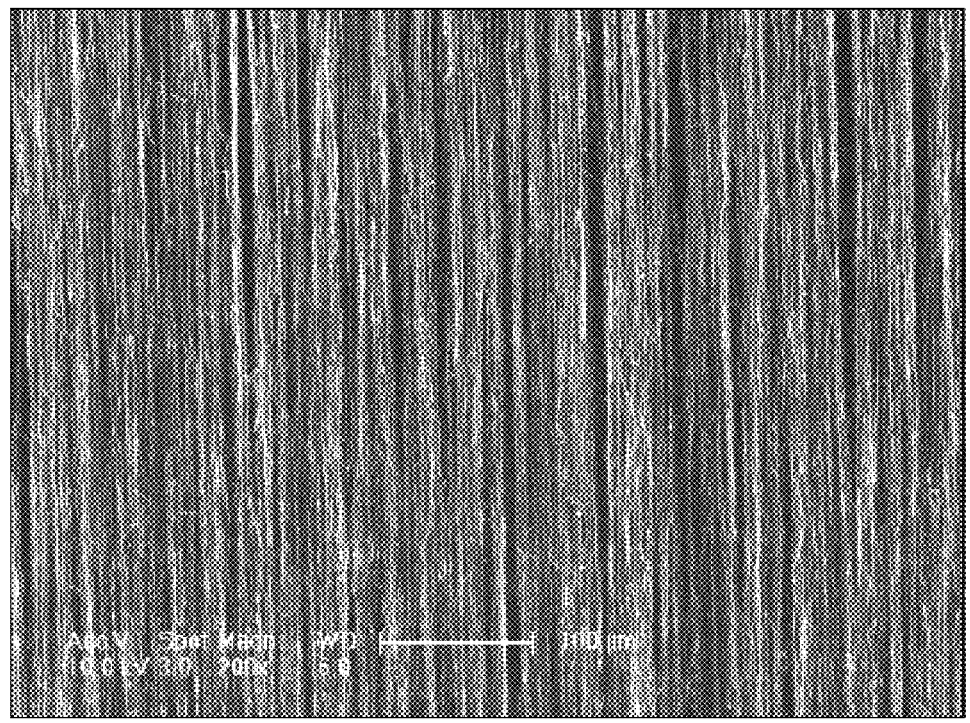
FIG. 2 is a Scanning Electron Microscope (SEM) image of a drawn carbon nanotube film used in the method of FIG. 1.
Figure 4:
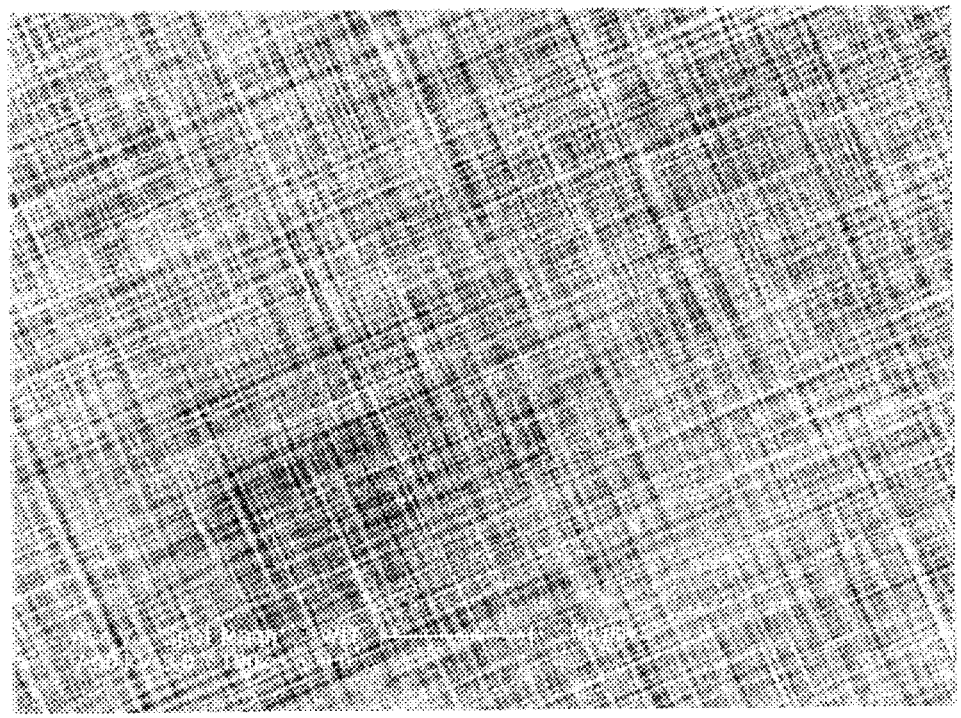
FIG. 4 is an SEM image of cross-stacked drawn carbon nanotube films used in the method of FIG. 1.

In one embodiment, the carbon nanotubes in the carbon nanotube layer 102 are arranged to extend along a direction substantially parallel to the surface of the carbon nanotube layer 102 to obtain a better pattern and greater light transmission. After being placed on the epitaxial growth surface 101, the carbon nanotubes in the carbon nanotube layer 102 are arranged to extend along the direction substantially parallel to the epitaxial growth surface 101. Referring to FIG. 2, all the carbon nanotubes in the carbon nanotube layer 102 are arranged to extend substantially along the same direction. Referring to FIG. 4, part of the carbon nanotubes in the carbon nanotube layer 102 are arranged to extend substantially along a first direction. The other part of the carbon nanotubes in the carbon nanotube layer 102 are arranged to extend along a second direction substantially perpendicular to the second direction. Also the carbon nanotubes in the ordered carbon nanotube structure can be arranged to extend substantially along the crystallographic orientation of the substrate 100 or along a direction which forms an angle with the crystallographic orientation of the substrate 100.

The carbon nanotube layer 102 can be formed on the epitaxial growth surface 101 by chemical vapor deposition (CVD), transfer printing a preformed carbon nanotube film, filtering, or depositing a carbon nanotube suspension. In one embodiment, the carbon nanotube layer 102 is a free-standing structure and can be drawn from a carbon nanotube array. The term "free-standing structure" means that the carbon nanotube layer 102 can sustain the weight of itself if it is hoisted by a portion thereof without any significant damage to its structural integrity. Thus, the carbon nanotube layer 102 can be suspended by two spaced supports. The free-standing carbon nanotube layer 102 can be laid on the epitaxial growth surface 101 directly and easily.

The carbon nanotube layer 102 can be a continuous structure or a discontinuous structure. The discontinuous carbon nanotube layer 102 includes a number of carbon nanotube wires substantially parallel to each other. If the carbon nanotube layer 102 has carbon nanotube wires substantially parallel to each other and a supporting force is applied to the carbon nanotube layer 102 in a direction substantially perpendicular to axial directions of the carbon nanotube wires, the parallel carbon nanotube wires can form a free-standing structure. The successive carbon nanotubes are joined end to end by van der Waals attractive force in a direction substantially parallel to an axial direction of the carbon nanotube and the carbon nanotubes are connected with each other by van der Waals attractive force in a direction substantially perpendicular to an axial direction of the carbon nanotubes.

The carbon nanotube layer 102 can be a substantially pure structure of the carbon nanotubes, with few impurities and chemical functional groups. The carbon nanotube layer 102 can be a composite including a carbon nanotube matrix and some non-carbon nanotube materials. The non-carbon nanotube materials can be graphite, graphene, silicon carbide, boron nitride, silicon nitride, silicon dioxide, diamond, or amorphous carbon, metal carbides, metal oxides, or metal nitrides. The non-carbon nanotube materials can be coated on the carbon nanotubes of the carbon nanotube layer 102 or filled in the apertures 105. In one embodiment, the non-carbon nanotube materials are coated on the carbon nanotubes of the carbon nanotube layer 102 so the carbon nanotubes can have greater diameter, and the apertures 105 can have smaller sizes. The non-carbon nanotube materials can be deposited on the carbon nanotubes of the carbon nanotube layer 102 by CVD or physical vapor deposition (PVD), for example sputtering.

Furthermore, the carbon nanotube layer 102 can be treated with an organic solvent after being placed on the epitaxial growth surface 101 so the carbon nanotube layer 102 can be attached on the epitaxial growth surface 101 firmly. Specifically, the organic solvent can be applied to entire surface of the carbon nanotube layer 102 or the entire carbon nanotube layer 102 can be immerged in an organic solvent. The organic solvent can be volatile, for example ethanol, methanol, acetone, dichloroethane, chloroform, or mixtures thereof. In one embodiment, the organic solvent is ethanol.

The carbon nanotube layer 102 can include at least one carbon nanotube film, at least one carbon nanotube wire, or a combination thereof. In one embodiment, the carbon nanotube layer 102 can include a single carbon nanotube film or two or more stacked carbon nanotube films. Thus, the thickness of the carbon nanotube layer 102 can be controlled by the number of stacked carbon nanotube films. The number of stacked carbon nanotube films can be in a range from about 2 to about 100, for example about, 10, 30 or 50. In one embodiment, the carbon nanotube layer 102 can include a layer of substantially parallel and spaced carbon nanotube wires. Also, the carbon nanotube layer 102 can include a plurality of carbon nanotube wires crossed, or weaved together to form a carbon nanotube net. The distance between two adjacent parallel and spaced carbon nanotube wires can be in a range from about 0.1 μm to about 200 μm. In one embodiment, the distance between two adjacent parallel and spaced carbon nanotube wires can be in a range from about 10 μm to about 100 μm. The size of the apertures 105 can be controlled by the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

A drawn carbon nanotube film is composed of a plurality of carbon nanotubes. A large majority of the carbon nanotubes in the drawn carbon nanotube film can be oriented along a preferred orientation, meaning that a large majority of the carbon nanotubes in the drawn carbon nanotube film are arranged substantially along the same direction. An end of one carbon nanotube is joined to another end of an adjacent carbon nanotube arranged substantially along the same direction by van der Waals attractive force. The drawn carbon nanotube film is capable of forming a freestanding structure. The successive carbon nanotubes joined end to end by van der Waals attractive force realizes the freestanding structure of the drawn carbon nanotube film.

Some variations can occur in the orientation of the carbon nanotubes in the drawn carbon nanotube film. Microscopically, the carbon nanotubes oriented substantially along the same direction may not be perfectly aligned in a straight line, and some curve portions may exist. A contact between some carbon nanotubes located substantially side by side and oriented along the same direction cannot be totally excluded.

The structure of the drawn carbon nanotube film and the method for making the drawn carbon nanotube film is illustrated as follows.

Figure 3:
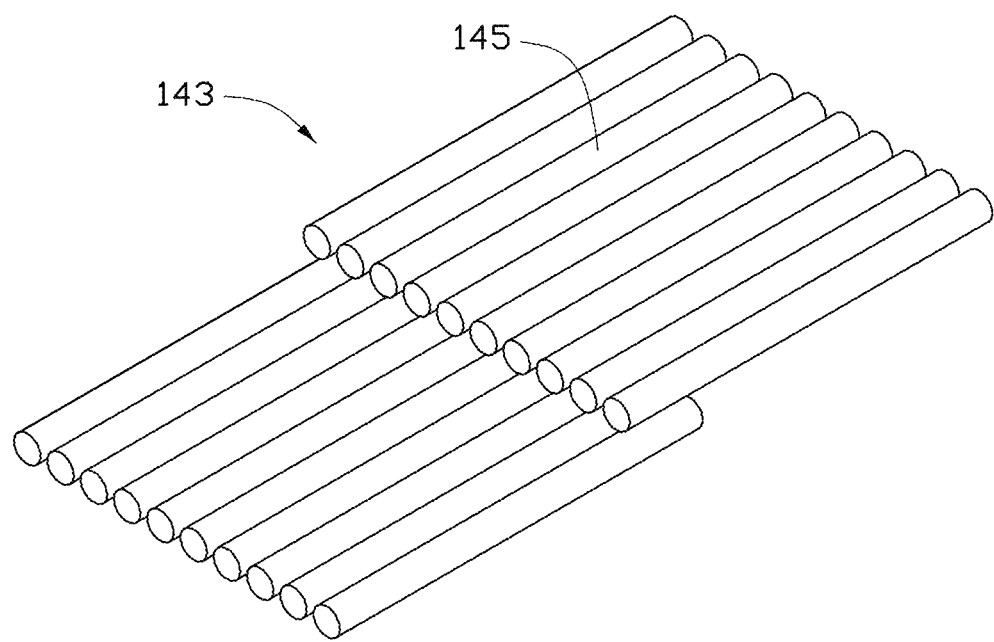
FIG. 3 is a schematic structural view of a carbon nanotube segment of the drawn carbon nanotube film of FIG. 2.

Referring to FIGS. 2 and 3, each drawn carbon nanotube film includes a plurality of successively oriented carbon nanotube segments 143 joined end-to-end by van der Waals attractive force therebetween. Each drawn carbon nanotube segment 143 includes a plurality of carbon nanotubes 145 substantially parallel to each other, and combined by van der Waals attractive force therebetween. The drawn carbon nanotube segments 143 can vary in width, thickness, uniformity, and shape. The carbon nanotubes in the drawn carbon nanotube film are also substantially oriented along a preferred orientation. A thickness of the drawn carbon nanotube film can range from about 1 nm to about 100 μm in one embodiment. The thickness of the drawn carbon nanotube film can range from about 100 nm to about 10 μm in another embodiment. A width of the drawn carbon nanotube film relates to the carbon nanotube array from which the drawn carbon nanotube film is drawn. The apertures between the carbon nanotubes in the drawn carbon nanotube film can form the apertures 105 in the carbon nanotube layer 102. The apertures between the carbon nanotubes in the drawn carbon nanotube film can be less than 10 μm. Examples of the drawn carbon nanotube film are taught by U.S. Pat. No. 7,045,130 to Jiang et al., and WO 2007015710 to Zhang et al.

Figure 6:
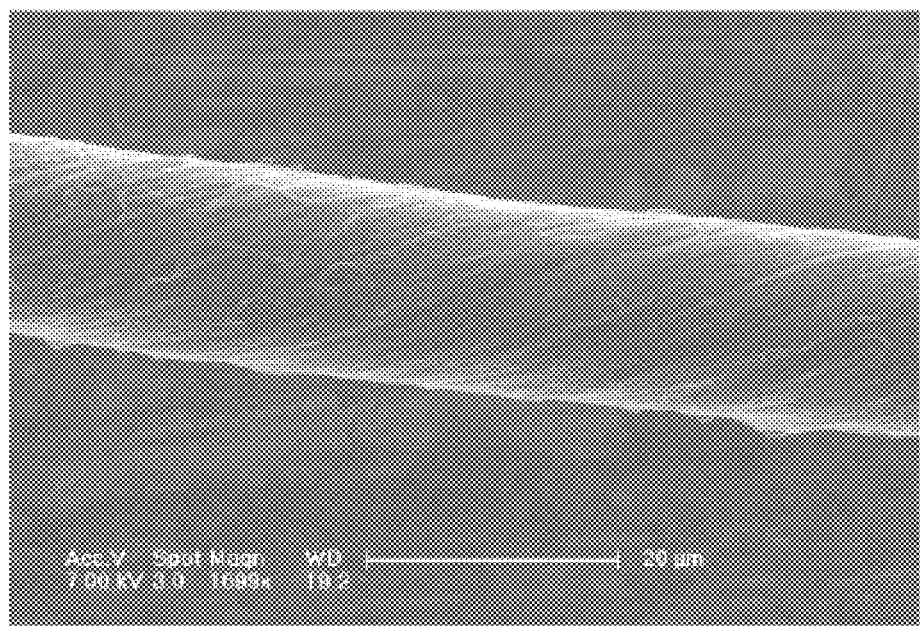
FIG. 6 is an SEM image of twisted carbon nanotube wires used in the method of FIG. 1.

The carbon nanotube layer 102 includes at least two drawn carbon nanotube films stacked with each other. In other embodiments, the carbon nanotube layer 102 can include two or more coplanar carbon nanotube films, and can include layers of coplanar carbon nanotube films. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by van der Waals attractive force therebetween. An angle between the aligned directions of the carbon nanotubes in the two adjacent drawn carbon nanotube films can range from about 0 degrees to about 90 degrees ($0° \leq \alpha \leq 90°$). If $\alpha$ is about $0°$, the two adjacent drawn carbon nanotube films are arranged in the same direction with each other. If the angle between the aligned directions of the carbon nanotubes in adjacent stacked drawn carbon nanotube films is larger than 0 degrees, a plurality of micropores is defined by the carbon nanotube layer 102. Referring to FIG. 6, the carbon nanotube layer 102 shown with the angle between the aligned directions of the carbon nanotubes in adjacent stacked drawn carbon nanotube films is about 90 degrees. The stacked drawn carbon nanotube films can improve the strength and maintain the shape of the carbon nanotube layer 102. Stacking the carbon nanotube films will also increase the structural integrity of the carbon nanotube layer 102.

Furthermore, the carbon nanotube layer 102 can be heated to decrease the thickness of the carbon nanotube layer 102. If the carbon nanotube layer 102 is heated, the carbon nanotubes with larger diameter will absorb more energy and be destroyed. The carbon nanotube layer 102 can be heated locally to protect the carbon nanotube layer 102 from damage. In one embodiment, the carbon nanotube layer 102 is heated by dividing a surface of the carbon nanotube layer 102 into a number of local areas and heating all of the local areas of the carbon nanotube layer 102 one by one. The carbon nanotube layer 102 can be heated by a laser or a microwave. In one embodiment, the carbon nanotube layer 102 is heated by the laser and a power density of the laser is greater than $0.1 \times 102$ W/m$^2$.

The laser can irradiates the carbon nanotube layer 102 in many ways. The direction of the laser can be substantially perpendicular to the surface of the carbon nanotube layer 102. The moving direction of the laser can be substantially parallel or perpendicular to axial directions of the carbon nanotubes in the carbon nanotube layer 102. For a laser with a stable power density and wavelength, the slower the moving speed of the laser, the more the carbon nanotubes of the carbon nanotube layer 102 will be destroyed, and the thinner the carbon nanotube layer 102. However, if the speed is too slow, the carbon nanotube layer 102 will be completely destroyed. In the present embodiment, a power density of the laser is about $0.053 \times 10^{12}$ W/m$^2$, a diameter of the irradiating pattern of the laser is in a range from about 1 mm to about 5 mm, and a time of laser irradiation is less than 1.8 seconds. In the present embodiment, the laser is a carbon dioxide laser and the power density of the laser is about 30 W, a wavelength of the laser is about 10.6 μm, and the diameter of the irradiating pattern of the laser is about 3 mm. A moving speed of the laser device is less than 10 m/s.

Figure 5:
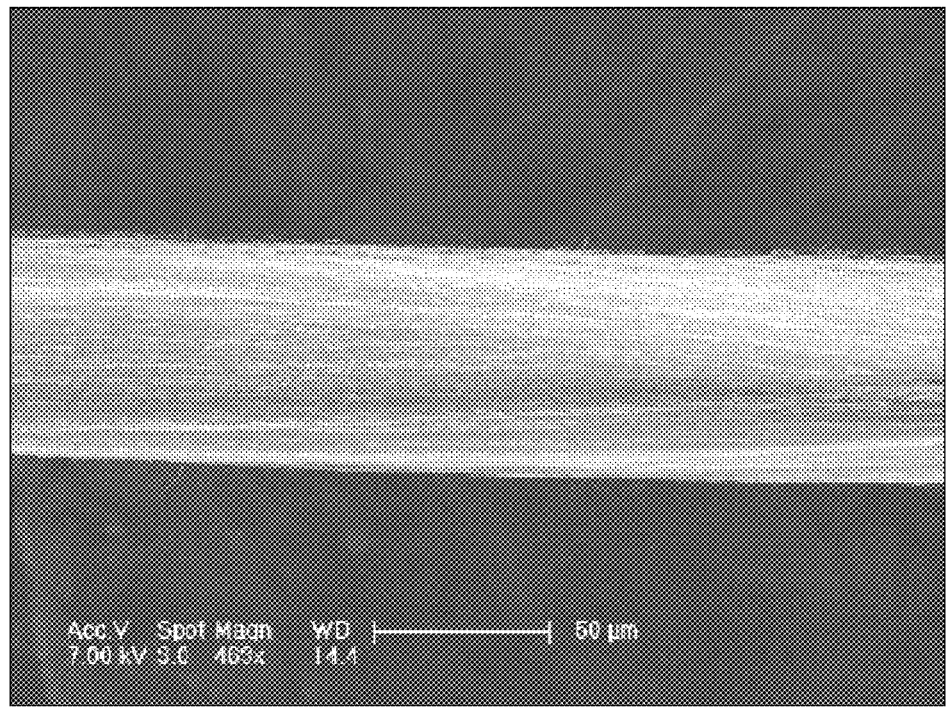
FIG. 5 is an SEM image of untwisted carbon nanotube wires used in the method of FIG. 1.

The carbon nanotube wire can be an untwisted carbon nanotube wire or a twisted carbon nanotube wire. Both of the untwisted carbon nanotube wire or twisted carbon nanotube wire can be a free-standing structure. Referring to FIG. 5, the untwisted carbon nanotube wire includes a plurality of carbon nanotubes substantially oriented along a direction along the length of the untwisted carbon nanotube wire. Specifically, the untwisted carbon nanotube wire includes a plurality of successive carbon nanotube treated segment joined end to end by van der Waals attractive force therebetween. Each carbon nanotube treated segment includes a plurality of carbon nanotubes substantially parallel to each other, and combined by van der Waals attractive force therebetween. The carbon nanotube treated segments can vary in width, thickness, uniformity, and shape. The length of the untwisted carbon nanotube wire can be arbitrarily set as desired. A diameter of the untwisted carbon nanotube wire is in a range from about 0.5 nm to about 100 μm. The untwisted carbon nanotube wire is formed by treating the carbon nanotube film with an organic solvent. Specifically, the carbon nanotube film is treated by applying the organic solvent to the carbon nanotube film to soak the entire surface of the carbon nanotube film. After being soaked by the organic solvent, adjacent paralleled carbon nanotubes in the carbon nanotube film will bundle together due to the surface tension of the organic solvent as the organic solvent volatilizes, and thus, the carbon nanotube film will be shrunk into an untwisted carbon nanotube wire.

The twisted carbon nanotube wire is formed by twisting a carbon nanotube film by a mechanical force to turn the two ends of the carbon nanotube film in opposite directions. Referring to FIG. 6, the twisted carbon nanotube wire includes a plurality of carbon nanotubes oriented around an axial direction of the twisted carbon nanotube wire. The carbon nanotubes are aligned around the axis of the carbon nanotube twisted wire like a helix. More specifically, the twisted carbon nanotube wire includes a plurality of successive carbon nanotube segment joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the carbon nanotube wire can be arbitrarily set as desired. A diameter of the twisted carbon nanotube wire can be in a range from about 0.5 nm to about 100 μm.

Further, the twisted carbon nanotube wire can be treated with a volatile organic solvent. After being soaked by the organic solvent, the adjacent paralleled carbon nanotubes in the twisted carbon nanotube wire will bundle together as the organic solvent volatilizes. The specific surface area of the twisted carbon nanotube wire will decrease, and the density and strength of the twisted carbon nanotube wire will increase. Examples of the carbon nanotube wire are taught by U.S. Pat. No. 7,045,130 to Jiang et al., and US 20100173037 A1 to Jiang et al.

As discussed above, the carbon nanotube layer 102 can be used as a mask for growing the first semiconductor layer 120. The term 'mask' means that the carbon nanotube layer 101 can be used to shelter part of the epitaxial growth surface 101 and expose the other part of the epitaxial growth surface 101. Thus, the first semiconductor layer 120 can grow from the exposed epitaxial growth surface 101. The carbon nanotube layer 101 can form a pattern mask on the epitaxial growth surface 101 because the carbon nanotube layer 102 defines a plurality of first openings 105. The method of forming a carbon nanotube layer 102 as mask is simple, low cost, and will not pollute the substrate 100 when compared to lithography or etching.

The carbon nanotube layer 102 can be suspended in any manner as long as the suspended carbon nanotube layer 102 corresponding to the epitaxial growth surface 101 of the substrate 100 is spaced from and suspended above the epitaxial growth surface 101 of the substrate 100. In one embodiment, two opposite ends of the carbon nanotube layer 102 are fixed and pulled up to suspend the carbon nanotube layer 102. In another embodiment, two opposite ends of the carbon nanotube layer 102 are fastened on two spaced supporters to suspend the carbon nanotube layer 102. In one embodiment, the carbon nanotube layer 102 is substantially parallel to and spaced from the epitaxial growth surface 101 of the substrate 100. The extending directions of the carbon nanotubes in the carbon nanotube layer 102 are substantially parallel to the epitaxial growth surface 101. The distance between the carbon nanotube layer 102 and the epitaxial growth surface 101 can be in a range from about 10 nm to about 500 μm. In one embodiment, the distance between the carbon nanotube layer 102 and the epitaxial growth surface 101 can be in a range from about 50 nm to about 500 μm. In another embodiment, the distance between the carbon nanotube layer 102 and the epitaxial growth surface 101 is about 10 μm. The carbon nanotube layer 102 is very close to the epitaxial growth surface 101, therefore the first semiconductor layer 120 can permeate the carbon nanotube layer 102 and enclose the carbon nanotube layer 102 easily during the growth of the first semiconductor layer 120. The dislocation density in the first semiconductor layer 120 is also low. As a result, the efficiency of making the LED 10 is improved and the cost of making the LED is low.

In one embodiment, a method for suspending the carbon nanotube layer 102 includes:

S121, providing a supporting device;

S122, fixing the carbon nanotube layer 102 on the supporting device; and

S123, suspending the carbon nanotube layer 102 above the epitaxial growth surface 101 by the supporting device.

In step S121, the material of the supporting device should have a certain mechanical strength to support the carbon nanotube layer 102. In one embodiment, the material of the supporting device may be pure metal and metal alloy or conductive composites. In one embodiment, the supporting device includes a first support 112 and a second support 114 spaced from the first support 112. A distance between the first support 112 and the second support 114 is selected according to a size of the substrate 100. In one embodiment, the distance between the first support 112 and the second support 114 is larger than the size of the substrate 100. Therefore, the entire carbon nanotube layer 102 is suspended. The shape of the first support 112 and the second support 114 should have a plant surface and the end of the carbon nanotube layer 102 can be fastened to the plant surface. In one embodiment, each of the first support 112 and the second support 114 is a cuboid. In another embodiment, the supporting device is a frame. The shape of the frame is the same as the substrate 100 and the size of the frame is larger than the substrate 100. The edge of the carbon nanotube layer is fastened on the frame.

In step S122, one end of the carbon nanotube layer 102 is fastened on the first support 112, and an opposite end of the carbon nanotube layer 102 is fastened on the second support 114. The carbon nanotube layer 102 has a certain viscosity, therefore, the carbon nanotube layer 102 can be fastened to the supporting device directly. The carbon nanotube layer 102 is suspended and stretched by the supporting device.

In step S123, the first support 112 and the second support 114 are located on opposite sides of the substrate 100, respectively.

In step S13, the first semiconductor layer 120, the active layer 130, and the second semiconductor layer 140 are grown in sequence by a molecular beam epitaxy (MBE), chemical beam epitaxy (CBE), vacuum epitaxy, low temperature epitaxy, selective epitaxy, liquid phase deposition epitaxy (LPE), metal organic vapor phase epitaxy (MOVPE), ultra-high vacuum chemical vapor deposition (UHVCVD), hydride vapor phase epitaxy (HYPE), or metal organic chemical vapor deposition (MOCVD).

Materials of the first semiconductor layer 120, the active layer 130, and the second semiconductor layer 140 can be identical. The materials of the first semiconductor layer 120, the active layer 130, and the second semiconductor layer 140 can be controlled by changing the material of the source gas during the growth procession.

A thickness of the first semiconductor layer 120 can be selected according to need. The thickness of the first semiconductor layer 120 can be in a range from about 200 nm to about 15 μm. In one embodiment, the thickness of the first semiconductor layer 120 may be about, 300 nm, 500 nm, 1 μm, 3 μm, 5 μm, or 10 μm. The first semiconductor layer 120 can be an N-type semiconductor layer or a P-type semiconductor layer. The N-type semiconductor layer provides electrons, and the P-type semiconductor layer provides cavities. The N-type semiconductor layer can be made of N-type gallium nitride, N-type gallium arsenide, or N-type copper phosphate. The P-type semiconductor layer can be made of P-type gallium nitride, P-type gallium arsenide, or P-type copper phosphate. In one embodiment, the first semiconductor layer 120 is a Si-doped N-type gallium nitride semiconductor layer.

The active layer 130 is a photon exciting layer and can be one of a single quantum well layer or multilayer quantum well films. The active layer 130 can be made of gallium indium nitride (GaInN), aluminum indium gallium nitride (AlGaInN), gallium arsenide (GaSn), aluminum gallium arsenide (AlGaSn), gallium indium phosphide (GaInP), or aluminum gallium arsenide (GaInSn). The active layer 130, in which the cavities therein are filled by the electrons, can have a thickness of about 0.01 μm to about 0.6 μm. In one embodiment, the active layer 130 has a thickness of about 0.3 μm and includes a layer of InGaN/GaN.

The second semiconductor layer 140 can be an N-type semiconductor layer or a P-type semiconductor layer. The type of the second semiconductor layer 140 is different from the type of the first semiconductor layer 120. If the first semiconductor layer 120 is an N-type semiconductor, the second semiconductor layer 140 is a P-type semiconductor, and vice versa. A thickness of the second semiconductor layer 140 is in a range from about 0.1 μm to about 3 μm. A surface of the second semiconductor layer 140 away from the substrate 100 can act as a light-emitting face of the LED 10. In one embodiment, the second semiconductor layer 140 can be an Mg-doped P-type gallium nitride semiconductor layer, and a thickness of the second semiconductor layer 140 is about 0.3 μm.

In one embodiment, the first semiconductor layer 120 is prepared by the MOCVD method. During the MOCVD method, $H_2$, $N_2$ or a mixture thereof can be used as a carrier gas, trimethyl gallium can be used as a Ga source, silane can be used as a silicon source, and ammonia can be used as a nitrogen source gas. The MOCVD method for making the first semiconductor layer 120 comprises the following steps:

S131, putting the substrate 100 with the carbon nanotube layer 102 thereon into a reaction chamber, flowing a carrier gas into the reaction chamber, and heating the reaction chamber to about 1100° C. to about 1200° C. for about 200 sec to about 1000 sec;

S132, growing a low-temperature GaN layer by cooling the reaction chamber to about 500° C. to about 650° C. and flowing trimethyl gallium and ammonia gas into the reaction chamber;

S133, stopping the flow of the trimethyl gallium, increasing the temperature of the reaction chamber to about 1100° C. to about 1200° C., and then maintaining the temperature of the reaction chamber constant for about 30 sec to 300 sec;

S134, growing an intrinsic semiconductor layer by maintaining the temperature of the reaction chamber in a range from about 1000° C. to about 1100° C. and the pressure in the reaction chamber at about 100 torr to about 300 torr, and flowing the trimethyl gallium into the reaction chamber; and S135, growing a doped semiconductor layer by maintaining the temperature of the reaction chamber at about 1000° C. to about 1100° C., and further flowing silane into the reaction chamber.

In step S131, the substrate 100 is sapphire.

Figure 14:
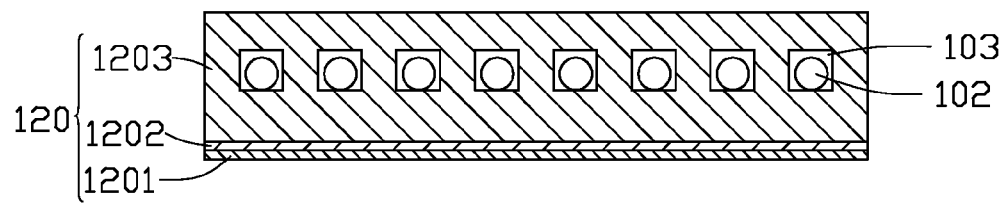
FIG. 14 is a magnified schematic strutural view of the first semiconductor layer 120 of the LED in FIG. 1.

In step S132, referring to FIG. 14, the low-temperature GaN layer can be used as a buffer layer 1201. A thickness of the low-temperature GaN layer can be in a range from about 10 nm to about 50 nm. The low-temperature GaN layer can reduce the lattice mismatch between the first semiconductor layer 120 and the sapphire substrate 100. Therefore, the dislocation density of the first semiconductor layer 120 is low. The material of the buffer layer 1201 can also be aluminium nitride.

In step S134, a thickness of the intrinsic semiconductor layer 1202 can be in a range from about 100 nm to about 10 μm.

The buffer layer 1201, the intrinsic semiconductor layer 1202 and the doped semiconductor layers 1203 are defined as the first semiconductor layer 120. In the above-described MOCVD method, the trimethyl gallium can be substituted with triethyl gallium.

During the growth of the first semiconductor layer 120, if the first semiconductor layer 120 contacts the carbon nanotube layer 102, the first semiconductor layer 120 grows through the apertures 105 of the carbon nanotube layer 102. The first semiconductor layer 120 then grows from flanks of the carbon nanotubes in the carbon nanotube layer 102. The first semiconductor layer 120 further grows along a direction substantially parallel to the epitaxial growth surface 101 and encloses the carbon nanotubes of the carbon nanotube layer 102. Therefore, a number of channels 103 are formed in the first semiconductor layer 120 for the carbon nanotube layer 102.

In one embodiment, a number of epitaxial grains of the first semiconductor layer 120 grow from the substrate 100. If the epitaxial grains contact the carbon nanotube layer 102, the epitaxial grains grow through the apertures 105 of the carbon nanotube layer 102 and further grow along a direction substantially parallel to the epitaxial growth surface 101 to connect together and enclose the carbon nanotube layer 102. The epitaxial grains further grow along a direction substantially perpendicular to the epitaxial growth surface 101 to form the first semiconductor layer 120. A number of channels 103 are formed in the first semiconductor layer 120 due to the carbon nanotubes. At least one single carbon nanotube or one carbon nanotube bundle is located in each channel 103.

The cross-section of the channel 103 can be geometrically shaped. A diameter of the channel 103 is in a range from about 20 nm to about 200 nm. In one embodiment, the diameter of the channel 103 is in a range from about 50 nm to about 100 nm. The channels 103 form a patterned microstructure in the first semiconductor layer 120. The patterned microstructure in the first semiconductor layer 120 corresponds to the pattern of the carbon nanotube layer 102. If the carbon nanotube layer 102 includes a number of cross-stacked carbon nanotube films or a number of carbon nanotube wires crossed with each other or woven together, the channels 103 in the first semiconductor layer 120 form an interconnected channel network. The carbon nanotubes in the channel network constitute the conductive carbon nanotube layer 102. If the carbon nanotube layer 102 includes a number of carbon nanotube wires substantially parallel to and spaced from each other or a drawn carbon nanotube film, the channels 103 in the first semiconductor layer 120 are substantially parallel to and spaced from each other. In one embodiment, distances between two adjacent channels 103 are substantially equal.

A method for growing the active layer 130 is similar to the method for growing the first semiconductor layer 120. The active layer 130 is grown after the step of growing the first semiconductor layer 120. During the growth of the active layer 130, the trimethyl indium is used as the indium source. In one embodiment, a method for growing the active layer 130 includes the following steps:

Step a1, stopping the flow of the silane into the reaction chamber after the step S135 of growing the first semiconductor layer 120, heating the reaction chamber to about 700° C. to about 900° C., and maintaining pressure of the reaction chamber at about 50 torr to about 500 torr; and Step a2, forming the active layer 130 by flowing trimethyl indium into the reaction chamber to grow InGaN/GaN multi-quantum well layer.

A method for growing the second semiconductor layer 140 is similar to the method for growing the first semiconductor layer 120. The second semiconductor layer 140 is grown after growing the active layer 130. During the growth of the second semiconductor layer 140, ferrocene magnesium can be used as the magnesium source. In one embodiment, the method for growing the second semiconductor layer 140 includes the following steps:

Step b1, stopping the flow of the trimethyl indium into the reaction chamber after the step a2 of growing the active layer 130, heating the reaction chamber to about 1000° C. to about 1100° C. and maintaining the pressure of the reaction chamber at about 76 torr to about 200 torr; and Step b2, forming the second semiconductor layer 140 by flowing ferrocene magnesium into the reaction chamber to grow Mg-doped P-type GaN layer.

In step S14, the portion of the second semiconductor layer 140 and the active layer 130 are etched by a reactive ion etching. After the active layer 130 is etched, a portion of the first semiconductor layer 120 can also be etched by reactive ion etching. However, after the first semiconductor layer 120 is etched, the carbon nanotube layer 102 should not be exposed. The substrate 100, the carbon nanotube layer 102, the first semiconductor layer 120, the active layer 130, and the second semiconductor layer 140 constitute an LED chip.

In one embodiment, the active layer 130 is made of InGaN/GaN layer and the second semiconductor layer 140 is made of P-type GaN layer. The second semiconductor layer 140 and the active layer 130 can be etched by placing the LED chip into an inductively coupled plasma device and adding a mixture of silicon tetrachloride and chlorine into the inductively coupled plasma device. In one embodiment, the power of the inductively coupled plasma device is about 50 W, the speed of the chlorine is about 26 sccm, and the speed of the silicon tetrachloride is about 4 sccm. The partial pressure of the silicon tetrachloride and chlorine is about 2 Pa. The etched thickness of the second semiconductor layer 140 is about 0.3 µm. The etched thickness of the active layer 130 is about 0.3 µm.

In step S15, the first electrode 150 is located on the exposed surface of the first semiconductor layer 120, and the second electrode 160 is located on a top surface of the second semiconductor layer 140. The first electrode 150 may be a P-type or an N-type electrode and is the same type as the first semiconductor layer 120. The second electrode 160 may be a P-type or an N-type electrode and is the same type as the second semiconductor layer 140.

A thickness of the first electrode 150 can range from about 0.01 µm to about 2 µm. A thickness of the second electrode 160 can range from about 0.01 µm to about 2 µm. The first electrode 150 can be made of titanium, aluminum, nickel, gold, or a combination thereof. In one embodiment, the first electrode 150 is an N-type electrode and includes a nickel layer and a gold layer. A thickness of the nickel layer is about 15 nm. A thickness of the gold layer is about 100 nm. In one embodiment, the second electrode 160 is a P-type electrode and includes a titanium layer and a gold layer. A thickness of the titanium layer is about 15 nm. A thickness of the gold layer is about 100 nm.

The first electrode 150 and the second electrode 160 can be formed simultaneously. The first electrode 150 and the second electrode 160 can be formed by PVD, for example, electron beam evaporation, vacuum evaporation, and ion sputtering method.

The method for making the LED 10 described above has many benefits. One benefit is the carbon nanotube layer 102 is a free-standing structure. Therefore, the carbon nanotube layer 102 can be laid directly on the substrate 100 directly without difficulty. Another benefit is the channels 103 are formed between the first semiconductor layer 120 and the substrate 100 without etching to avoid damage to the lattice structure of the LED. Yet another benefit is the carbon nanotubes in the carbon nanotube layer 102 are small enough so that the size of the grains of the first semiconductor layer 120 around the carbon nanotubes is small and dislocations of the first semiconductor layer 120 are fewer.

Figure 7:
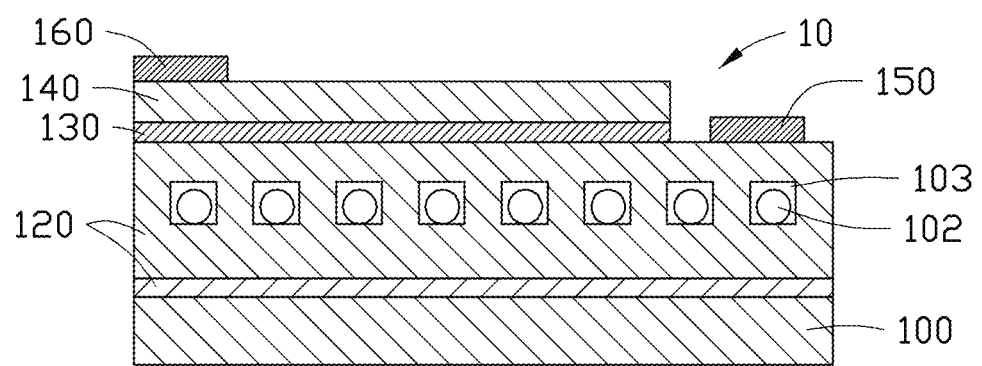
FIG. 7 is a schematic structural view of an LED making by the method in FIG. 1

Referring to FIG. 7, an LED 10 is illustrated in one embodiment. The LED 10 includes a substrate 100, a carbon nanotube layer 102, a first semiconductor layer 120, an active layer 130, a second semiconductor layer 140, a first electrode 150, and a second electrode 160. The first semiconductor layer 120, the active layer 130, and the second semiconductor layer 140 are stacked on one side of the substrate 100 in that order. The second semiconductor layer 140 away from the substrate 100 can be used as a light emitting surface. The first semiconductor layer 120, the active layer 130, and the second semiconductor layer 140 form a ladder-shaped structure. The first semiconductor layer 120 is oriented to the substrate 100. The carbon nanotube layer 102 is located in the interior of the first semiconductor layer 120. The first electrode 150 is electrically connected to the first semiconductor layer 120. The second electrode 160 is electrically connected to the second semiconductor layer 140. A number of channels 103 are formed in the interior of the first semiconductor layer 120. The carbon nanotube layer 102 is located in the channels 103 of the first semiconductor layer 120. At least one carbon nanotube is located in each of the channels 103.

The carbon nanotube layer 102 is a free-standing structure. The carbon nanotube layer 102 includes at least one carbon nanotube film or a number of carbon nanotube wires. The carbon nanotube layer 102 defines a number of apertures 105.

The apertures 105 extend through the carbon nanotube layer 102 along a thickness direction of the carbon nanotube layer 102. The aperture 105 can be a hole defined by several adjacent carbon nanotubes or a gap defined by two substantially parallel carbon nanotubes and extending along axial directions of the carbon nanotubes.

The first semiconductor layer 120 penetrates the apertures 105 of the carbon nanotube layer 102 and encloses the carbon nanotube layer 102 therein. The first semiconductor layer 120 is a continuous structure. The term "continuous structure" means that the first semiconductor layer 120 is not broken. A portion of the carbon nanotubes contacts the inner wall of the channels 103. If the carbon nanotube layer 102 includes the drawn carbon nanotube layer or the carbon nanotube wires are substantially parallel to and spaced from each other, the channels 103 are a plurality of strip channels 103 substantially paralleled to and spaced apart from each other. If the carbon nanotube layer 102 includes the carbon nanotube wires crossed with each other or a number of cross-stacked carbon nanotube films, the channels 103 form a channel network and the channel network is interconnected. If the carbon nanotube layer 104 is composed of a number of cross-stacked carbon nanotube films, angles defined between the carbon nanotubes in two adjacent carbon nanotube films is greater than 0 degrees and less than 90 degrees. The channels 103 form a microstructure in the first semiconductor layer 120. The cross-section of the channels 103 can be geometrically shaped. In one embodiment, the shape of the cross-section of the channels 103 is substantially round with a diameter in a range from about 2 nm to about 200 μm.

The LED 10 described-above has many benefits. One benefit is a number of channels 103 exit in the interior of the first semiconductor layer 120, the channels 103 can change the directions of lights emitted from the active layer 130, and the large angle lights can be emitted out of the LED 10. Therefore the light extracting rate of the LED 10 can be improved. Another benefit is the carbon nanotube layer 102 has good thermal conductivity. The heat produced in the LED 10 can be conducted out of the LED 10 by the carbon nanotube layer 102, thereby prolonging the life span of the LED 10.

Figure 8:
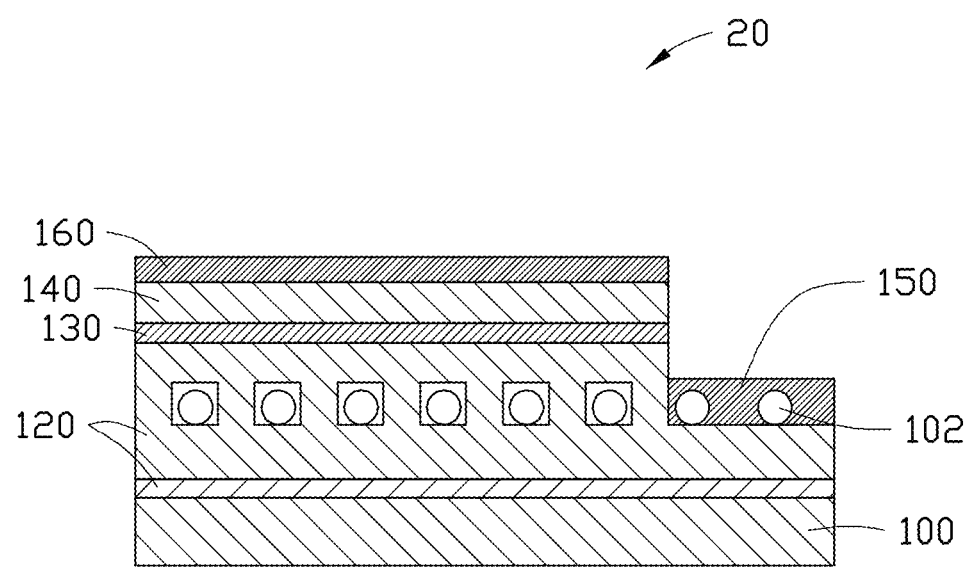
FIG. 8 is a schematic structural view of one embodiment of an LED.

Referring to FIG. 8, an LED 20 is illustrated in one embodiment. The LED 20 includes a substrate 100, a carbon nanotube layer 102, a first semiconductor layer 120, an active layer 130, a second semiconductor layer 140, a first electrode 150, and a second electrode 160. The first semiconductor layer 120, the active layer 130, and the second semiconductor layer 140 are stacked on one side of the substrate 100 in that order. The second semiconductor layer 140 away from the substrate 100 can be used as a light emitting surface. The first semiconductor layer 120, the active layer 130, and the second semiconductor layer 140 constitute a ladder-shaped structure. The first semiconductor layer 120 is oriented to the substrate 100. The carbon nanotube layer 102 is located in the first semiconductor layer 120. The first electrode 150 is electrically connected to the first semiconductor layer 120. The second electrode 160 is electrically connected to the second semiconductor layer 140.

The structure of the LED 20 is similar to the structure of the LED 10. The difference is that in the LED 20, a portion of the carbon nanotube layer 102 is exposed and the first electrode 150 is electrically connected to the carbon nanotube layer 102. The remaining portion of the carbon nanotube layer 102 is enclosed in the first semiconductor layer 120, the second electrode 160 is transparent and covers the entire surface of the second semiconductor layer 120, and the thickness of the second electrode 160 is thin.

A method for making the LED 20 of one embodiment is similar to the method for making the LED 10. The difference is that in step S14, after a portion of the second semiconductor layer 140 and the active layer 130 is etched, a portion of the first semiconductor layer 120 is further etched to expose a portion of the carbon nanotube layer 102. In step S15, the first electrode 150 is formed on the surface of the exposed carbon nanotube layer 102, the second electrode 160 covers the entire surface of the second semiconductor layer 140, and the second electrode 160 is transparent.

Figure 9:
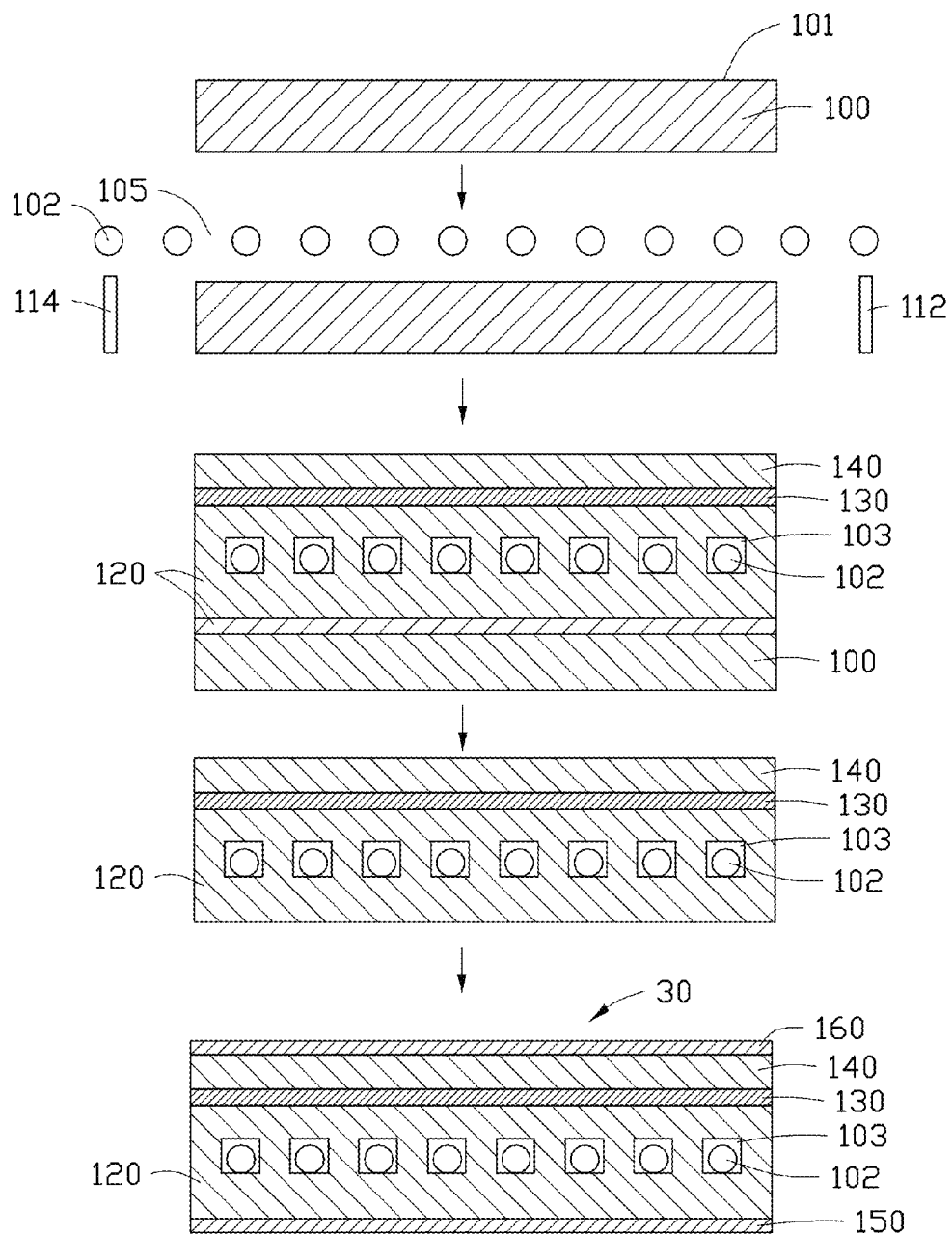
FIG. 9 is a flowchart of another embodiment of a method for making an LED.

Referring to FIG. 9, a method for making an LED 30 of one embodiment includes the following steps of:

S21, providing a substrate 100 having an epitaxial growth surface 101;

S22, suspending a carbon nanotube layer 102 above the epitaxial growth surface 101; and S23, growing a first semiconductor layer 120, an active layer 130 and a second semiconductor layer 140 on the epitaxial growth surface 101 in that order, wherein the first semiconductor layer 120 includes a buffer layer, an intrinsic semiconductor layer, and a doped semiconductor layer, the carbon nanotube layer 102 is enclosed in the doped semiconductor layer to form a microstructure in the first semiconductor layer 120;

S24, removing the substrate 100, the buffer layer, and the intrinsic semiconductor layer to expose the doped semiconductor layer; and S25, preparing a first electrode 150 electrically connected to the first semiconductor layer 120 and preparing a second electrode 160 electrically connected to the doped semiconductor layer of the second semiconductor layer 140.

The steps S21, S22, S23 in the method for making the LED 30 is the same as the step S11, S12, S13 in the method for making the LED 10.

In the step S24, the substrate 100 can be removed by laser irradiation, etching, or thermal expansion and contraction, depending on the material of the substrate 100 and the first semiconductor layer 120. In one embodiment, the substrate 100 is removed by laser irradiation. The substrate 100 can be removed from the first semiconductor layer 120 by the following steps:

S241, polishing and cleaning the surface of the substrate 100 far away from the first semiconductor layer 120;

S242, locating the substrate 100 on a platform (not shown) and irradiating the substrate 100 and the first semiconductor layer 120 by a laser; and S243, immersing the substrate 100 into a solvent and removing the substrate 100.

In step S241, the substrate 100 can be polished by a mechanical polishing method or a chemical polishing method to obtain a smooth surface. Thus the scattering of laser will be reduced. The substrate 100 can be cleaned with hydrochloric acid or sulfuric acid to remove the metallic impurities and oil.

In step S242, the substrate 100 is irradiated by the laser from the polished surface, and the incidence angle of the laser is substantially perpendicular to the surface of the substrate 100. The wavelength of the laser is selected according to the material of the first semiconductor layer 120 and the substrate 100. The energy of the laser is smaller than the band-gap energy of the substrate 100 and larger than the bandgap energy of the first semiconductor layer 120. Thus the laser can pass through the substrate 100 and reach the interface between the substrate 100 and the first semiconductor layer 120. The buffer layer oriented to the substrate 100 has a strong absorption of the laser, and the temperature of the buffer layer will be raised rapidly. Thus the buffer layer will be decomposed. In one embodiment, the band-gap energy of the first semiconductor layer 120 is about 3.3 ev, and the band-gap energy of the substrate 100 is about 9.9 ev. The laser is a KrF laser, the wavelength of the laser is about 248 nm, and the energy is about 5 ev, the pulse width range about 20 nanosecond to about 40 nanosecond, the energy density ranges from about 400 mJ/cm$^2$ to about 600 mJ/cm$^2$, and the shape of the laser pattern is square with a size of 0.5 mm×0.5 mm. The laser moves from one edge of the substrate 100 with a speed of about 0.5 mm/s During the irradiating process, the GaN is decomposed to Ga and N$_2$. The parameter of the laser can be adjusted according to need. The wavelength of the laser can be selected according to the absorption of the buffer layer.

Because the buffer layer has a strong absorption of the laser, the buffer layer decomposes rapidly. But the first semiconductor layer 120 has a weak absorption, so it can not be decomposed so readily. The irradiating process can be performed in a vacuum or a protective gas environment to prevent the oxidation of the carbon nanotubes. The protective gas can be nitrogen, helium, argon, or other inert gas.

In step S243, the substrate 100 can be immersed into an acidic solution to remove the Ga decomposed from GaN, so that the substrate 100 can be peeled off from the first semiconductor layer 120. The acidic solution can be hydrochloric acid, sulphuric acid, nitric acid, or any other acid to dissolve the Ga.

Furthermore, the intrinsic semiconductor layer can also be decomposed by ion etching or wet etching. After the intrinsic semiconductor layer is removed, the doped semiconductor layer is exposed. In one embodiment, a plasma etching method includes providing a inductively coupled plasma device, flowing a mixture of silicon tetrachloride, and adding chlorine to the inductively coupled plasma device to etch the intrinsic semiconductor layer. In one embodiment, the power of the inductively coupled plasma device is about 50 W, the speed of the chlorine is about 26 sccm, the speed of the silicon tetrachloride is about 4 sccm, and the partial pressure of the silicon tetrachloride and chlorine is about 2 Pa.

The thermal expansion and contraction method means that while the substrate 100 is heated to a high temperature above 1000° C. and cooled to a low temperature below 1000° C. in a short time from 2 minutes to about 20 minutes. The substrate 100 separates from the first semiconductor layer 120 by cracking because of the thermal expansion mismatch between the substrate 100 and the first semiconductor layer 120.

The method for making the first electrode 150 is the same as the method for making the second electrode 160. The first electrode 150 and the second electrode 160 can be made via a process of physical vapor deposition, for example electron beam evaporation, vacuum evaporation, ion sputtering, physical deposition, or the like. A conductive layer can be laid on the surface of the doped semiconductor layer directly to form the first electrode 150. The first electrode 150 is electrically connected to the first semiconductor layer 120. The first electrode 150 covers the entire surface of the first semiconductor layer 120 in one embodiment.

Figure 10:
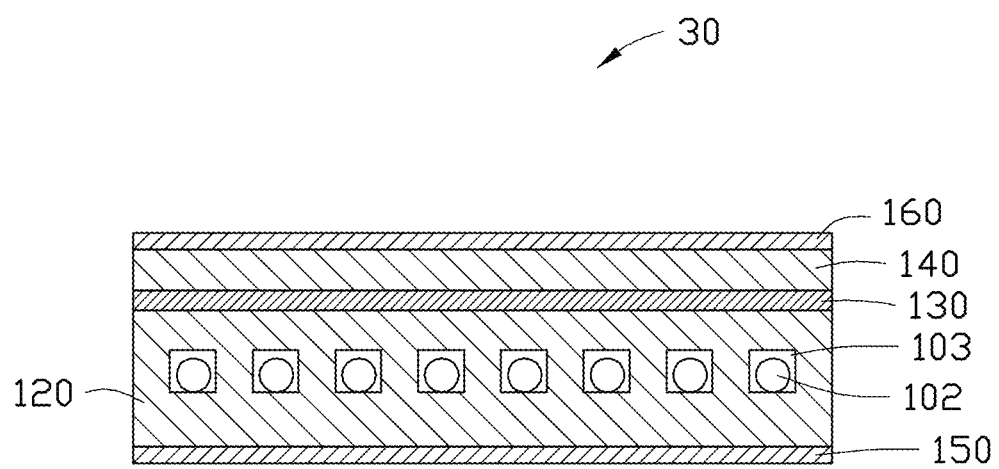
FIG. 10 is a schematic structural view of an LED made by the method in FIG. 9.

Referring to FIG. 10, an LED 30 is illustrated in one embodiment. The LED 30 includes a substrate 100, a carbon nanotube layer 102, a first semiconductor layer 120, an active layer 130, a second semiconductor layer 140, a first electrode 150, and a second electrode 160. The first semiconductor layer 120, the active layer 130, and the second semiconductor layer 140 are stacked on one side of the substrate 100 in that order. The second semiconductor layer 140 away from the substrate 100 can be used as a light emitting surface. The first semiconductor layer 120 is oriented to the substrate 100. The carbon nanotube layer 102 is located in the interior of the first semiconductor layer 120. The first semiconductor layer 120 is a doped semiconductor layer. In one embodiment, the first electrode 150 covers the entire surface of the first semiconductor layer 120 and the second electrode 160 covers the entire surface of the second semiconductor layer 140.

Figure 11:
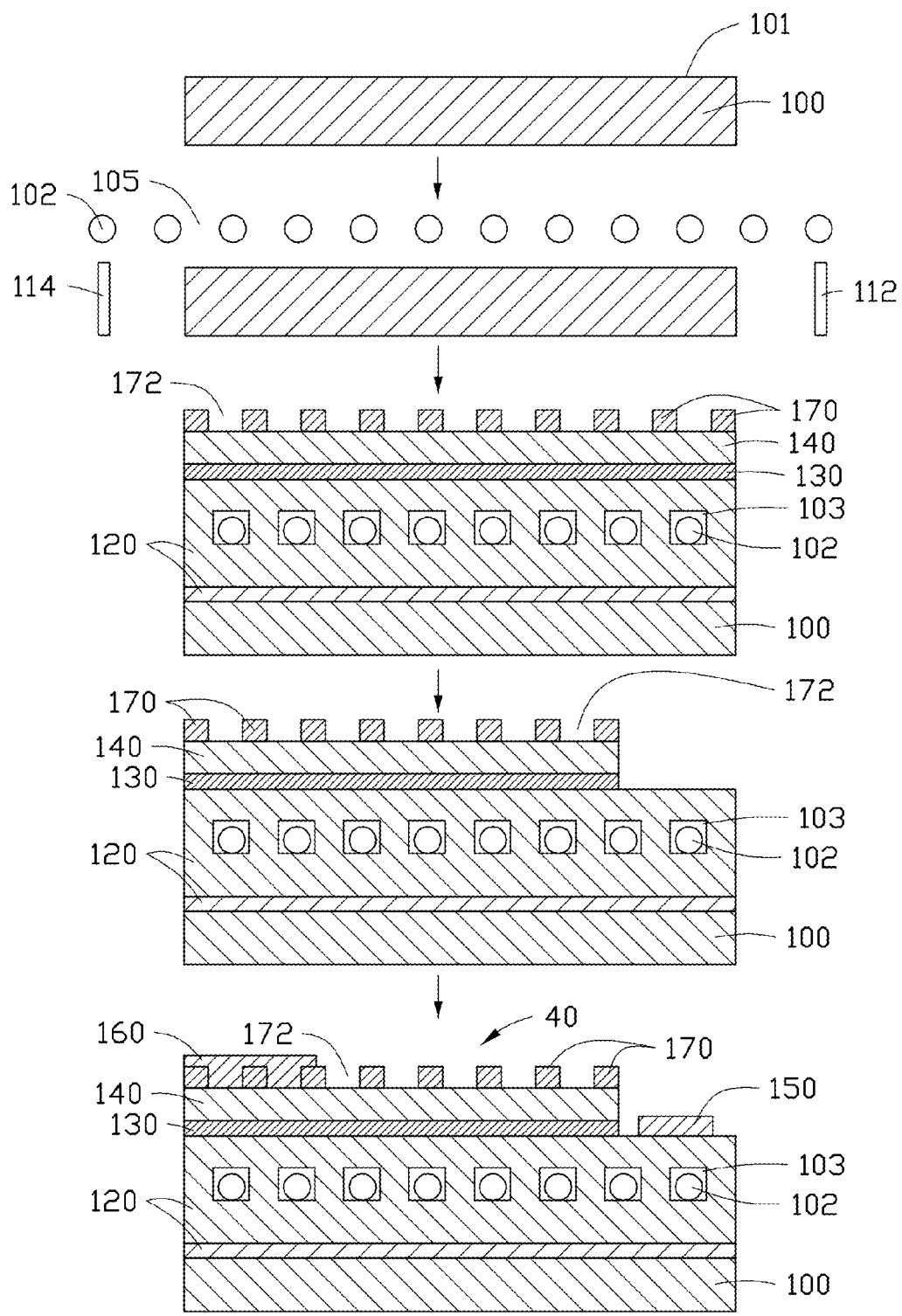
FIG. 11 is a flowchart of another embodiment of a method for making an LED.

Referring to FIG. 11, a method for making an LED 40 of one embodiment includes the following steps of:

S31, providing a substrate 100 having an epitaxial growth surface 101;

S32, suspending a first carbon nanotube layer 102 above the epitaxial growth surface 101;

S33, growing a first semiconductor layer 120, an active layer 130, and a second semiconductor layer 140 on the epitaxial growth surface 101 in that order, wherein the first carbon nanotube layer 102 is enclosed in the first semiconductor layer 120 to form a microstructure in the first semiconductor layer 120;

S34, forming a third semiconductor layer 170 on a surface of the second semiconductor layer 140, wherein the third semiconductor layer 170 includes a number of spaced protrusions to make the third semiconductor layer 170 discontinuous;

S35, exposing a portion of the first semiconductor layer 120 by etching a portion of the third semiconductor layer 170, the second semiconductor layer 140, and the active layer 108; and S36, preparing a first electrode 150 on the first semiconductor layer 120 and preparing a second electrode 160 on the second semiconductor layer 140.

The method for making the LED 40 is similar to the method for making the LED 10. The difference is that the method for making the LED 40 further comprises the step S34 of forming a third semiconductor layer 170 on the surface of the second semiconductor layer 140.

In step S34, the third semiconductor layer 170 can be formed by photolithography or imprinting.

A method for forming the third semiconductor layer 170 in one embodiment includes the following steps:

S341, placing a second carbon nanotube layer in the surface of the second semiconductor layer 140, wherein the second carbon nanotube layer defines a plurality of apertures;

S342, epitaxially growing the third semiconductor layer 170 from the surface of the second semiconductor layer 140; and S343, removing the second carbon nanotube layer.

In step S341, the structure and material of the second carbon nanotube layer are the same as the first carbon nanotube layer 102. The second carbon nanotube layer can be used as a mask for growing the third semiconductor layer 170. The term 'mask' means that the second carbon nanotube layer can be used to shelter part of the second semiconductor layer 140 and expose the other part of the second semiconductor layer 140. Thus, the third semiconductor layer 170 can grow from the exposed surface of the second semiconductor layer 140. The second carbon nanotube layer can form a pattern mask on the second semiconductor layer 140 because the second carbon nanotube layer defines a plurality of apertures.

The carbon nanotubes in the second carbon nanotube layer are substantially parallel to the surface of the second semiconductor layer 140. The second carbon nanotube layer includes a number of carbon nanotubes. The extending directions of the axial directions of the carbon nanotubes in the second carbon nanotube layer can be substantially parallel or cross with the extending directions of the carbon nanotubes in the first carbon nanotube layer 102. In one embodiment, axial directions of the carbon nanotubes of the second carbon nanotube layer are oriented substantially along one direction. In other embodiments, the second carbon nanotube layer includes a number of cross-stacked carbon nanotube films or a number of carbon nanotube wires crossed with each other or woven together to form a network structure.

In step S342, a number of epitaxial crystal grains are nucleated and grown from the surface of the second semiconductor layer 140 along a direction substantially perpendicular to the surface of the second semiconductor layer 140. The epitaxial crystal grains grow from the exposed part of the second semiconductor layer 140 and through the apertures of the second carbon nanotube layer. The epitaxial crystal grains form a number of discontinuous protrusions 172 on the surface of the second semiconductor layer 140. The protrusions 172 form the third semiconductor layer 170. The protrusions 172 are spaced to form a number of openings between two adjacent protrusions 172. The second carbon nanotube layer is located in the openings. In one embodiment, the openings are strip-shaped. The extending directions of the strip-shaped openings are substantially parallel to the surface of the second semiconductor layer 140. A width of the strip-shaped openings is in a range from about 20 nm to about 200 nm. In one embodiment, the width of the strip-shaped openings is in a range from about 50 nm to about 100 nm. The thickness of the third semiconductor layer 170 can be controlled by the growth time of the epitaxial crystal grains. In one embodiment, the thickness of the third semiconductor layer 170 is about 2 μm.

If axial directions of the carbon nanotubes of the second carbon nanotube layer are oriented along one direction, the protrusions 172 are strip-shaped and the strip-shaped protrusions 172 are spaced from and substantially parallel to each other. The extending directions of the strip-shaped protrusions 172 can be substantially parallel to or cross with the extending directions of the channels 103 in the first semiconductor layer 120. In one embodiment, a width of the strip-shaped protrusions 172 can be in a range from about 20 nm to about 200 nm. In another embodiment, the width of the strip-shaped protrusions 172 can be in a range from about 50 nm to about 100 nm. If the second carbon nanotube layer includes a number of cross-stacked carbon nanotube films or a number of carbon nanotube wires crossed with each other or woven together to form a network structure, the protrusions 172 can be scattered dot-shaped protrusions 172. The dot-shaped protrusions 172 are uniformly located on the surface of the second semiconductor layer 140. A size of the dot-shaped protrusions can be in a range from about 10 nm to about 10 μm.

The material of the third semiconductor layer 170 can be GaN, GaAs or CuP. The material of the third semiconductor layer 170 can be the same as or different from the second semiconductor layer 140. In one embodiment, the material of the third semiconductor layer 170 is Mg-doped GaN.

In step S343, the second carbon nanotube layer can be removed by plasma etching method, laser heating method, ultrasonic wave method, or furnace heating method. In one embodiment, the second carbon nanotube layer is removed by the laser heating method. The laser heating method includes the following steps:

S3432, providing a laser generator which can generate a laser to irradiate the second carbon nanotube layer; and S3434, scanning the second carbon nanotube layer by making a relative movement between the laser generator and the second carbon nanotube layer in an environment containing oxygen gas.

In step S3432, the laser generator can be a solid laser generator, liquid laser generator, gas laser generator, and semiconductor laser generator. A power density of the laser is larger than $0.053 \times 10^{12}$ W/m². As the laser irradiates the second carbon nanotube layer, a laser beam produced by the laser device is focused on the second carbon nanotube layer and forms a laser irradiating area, e.g., a circular area, on the second carbon nanotube layer, wherein a diameter of the laser irradiating area can be in a range from about 1 mm to about 5 mm. The laser beam is substantially perpendicular to the surface of the second carbon nanotube layer. An irradiating time of the laser can be shorter than about 1.8 sec. In one embodiment, the laser generator is a carbon dioxide laser generator, a power of the carbon dioxide laser generator is about 30 W, a wavelength of the laser is about 10.6 μm, and a diameter of the laser irradiating area is about 3 mm.

In step S3434, the direction of movement of the laser beam can be substantially parallel to or perpendicular to the axial directions of the carbon nanotubes in the second carbon nanotube layer. The carbon nanotubes can absorb the energy of the laser and be heated by the laser, and the carbon nanotubes can then react with the oxygen gas and be removed. The reaction time can be controlled by adjusting the relative moving speed between the laser generator and the second carbon nanotube layer. If the power density and the wavelength of the laser is fixed, the slower the relative moving speed of the laser generator and the second carbon nanotube layer, the longer the irradiation time of the carbon nanotubes. The longer the irradiation time of the carbon nanotubes, the more energy the carbon nanotubes absorb, and the easier the carbon nanotubes oxidizes. In one embodiment, the relative moving speed between the laser generator and the carbon nanotube layer 104 is less than 10 mm/sec.

It is to be understood that in step S342, when the thickness of the epitaxial crystal grains is larger than the thickness of the second carbon nanotube layer, the epitaxial crystal grains can further grow along a direction substantially parallel to the second semiconductor layer 140 and substantially enclose the entire second carbon nanotube layer. The epitaxial crystal grains then form a continuous third semiconductor layer 170. The step of removing the second carbon nanotube layer can then be omitted.

The epitaxial growth method for making the third semiconductor layer 170 by locating the second carbon nanotube layer as a mask is simple, low in cost, and readily available when compared to the traditional nano-imprinting method or etching method. The steps S35 and S36 in the method for making the LED 40 can be substituted by step S24 and step S25 in the method for making the LED 30.

Figure 12:
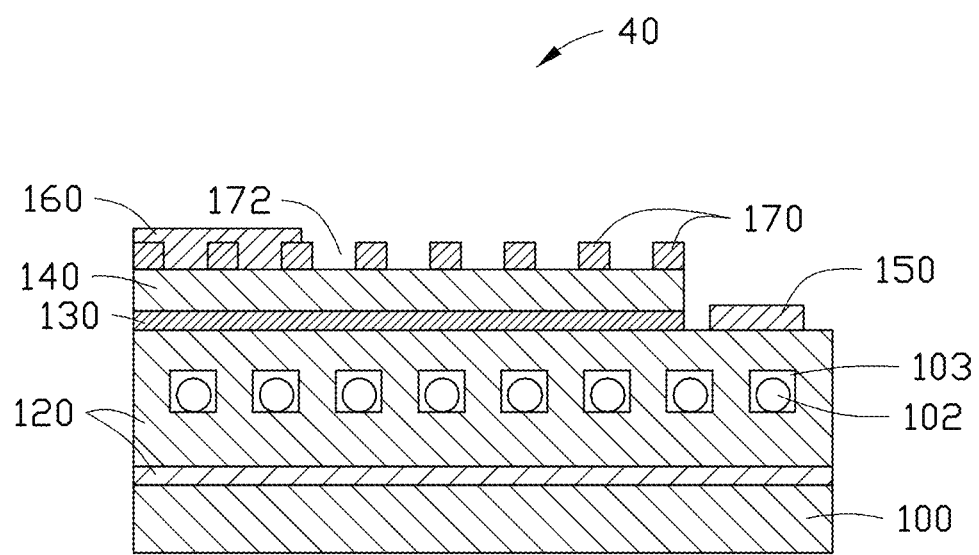
FIG. 12 is a schematic structural view of an LED made by the method in FIG. 11.

Referring to FIG. 12, an LED 40 is illustrated in one embodiment. The LED 40 includes a substrate 100, a carbon nanotube layer 102, a first semiconductor layer 120, an active layer 130, a second semiconductor layer 140, a first electrode 150, and a second electrode 160. The first semiconductor layer 120, the active layer 130, and the second semiconductor layer 140 are stacked on one side of the substrate 100 in that order. The second semiconductor layer 140 away from the substrate 100 can be used as a light emitting surface. The first semiconductor layer 120 is oriented to the substrate 100. The carbon nanotube layer 102 is located in the interior of the first semiconductor layer 120 to form a number of channels 103 in the first semiconductor layer 120. The carbon nanotube layer 102 is located in the channels 103. At least one carbon nanotube is located in each of the channels 103.

The structure of the LED 40 is similar to the structure of the LED 10. The difference is that a third semiconductor layer 170 is located on the surface of the second semiconductor layer 140, the third semiconductor layer 170 includes a number of protrusions 172 spaced from each other to form a number of openings. The third semiconductor layer 170 is discontinuous. In one embodiment, the protrusions 172 can be a number of strip-shaped protrusions 172. The strip-shaped protrusions 172 are spaced from and substantially parallel to each other. The cross-section of the strip-shaped protrusions 172 can be geometrically shaped. In one embodiment, the size of the cross-section of the strip-shaped protrusions 172 can be in a range from about 10 nm to about 100 nm. In another embodiment, a size of the cross-section of the strip-shaped protrusions 172 is in a range from about 20 nm to about 50 nm. A width of the strip-shaped protrusions 172 is in a range from about 10 nm to about 10 μm. In one embodiment, the strip-shaped protrusions 172 form a protrusion network. The protrusions 172 are interconnected.

The third semiconductor layer 170 forms a microstructure located on the surface of the second semiconductor layer 140. If large angle lights emitted from the active layer 130 travel to the third semiconductor layer 170, directions of the large angle lights will change and the large angle lights can pass through the third semiconductor layer 170 without being internally reflected. Therefore, the light extracting rate of the LED 40 will be improved.

Figure 13:
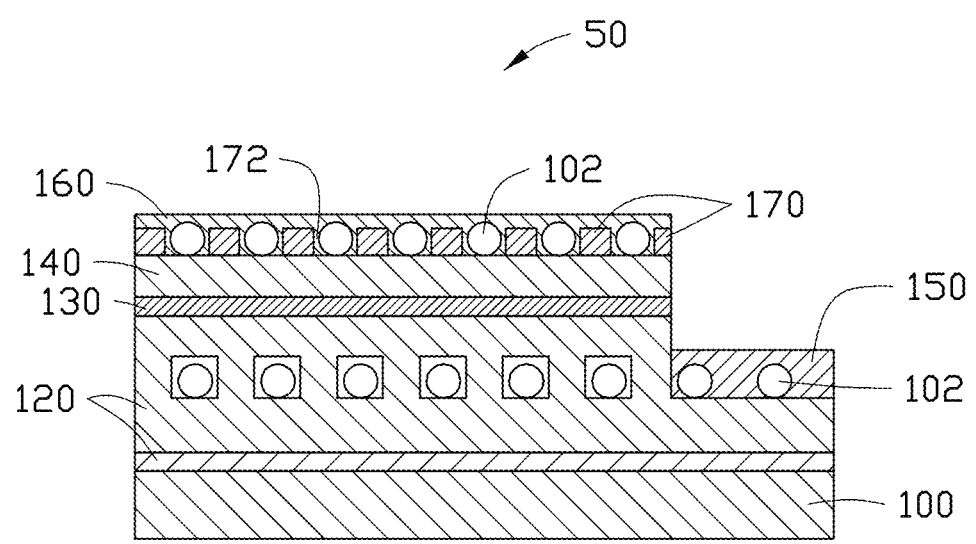
FIG. 13 is a schematic structural view of one embodiment of an LED.

Referring to FIG. 13, an LED 50 is illustrated in one embodiment. The LED 50 includes a substrate 100, a first carbon nanotube layer 102, a second carbon nanotube layer 104, a first semiconductor layer 120, an active layer 130, a second semiconductor layer 140, a third semiconductor layer 170, a first electrode 150, and a second electrode 160. The first semiconductor layer 120, the active layer 130, and the second semiconductor layer 140 are stacked on one side of the substrate 100 in that order. The first semiconductor layer 120 is oriented to the substrate 100. The second electrode 160 can be used as a light emitting surface. A portion of the first carbon nanotube layer 102 is enclosed in the first semiconductor layer 120. A remaining portion of the first carbon nanotube layer 102 is exposed. The first electrode 150 is electrically connected to the exposed portion of the first carbon nanotube layer 102. The first electrode 150 is electrically connected to the first semiconductor layer 120 by the first carbon nanotube layer 102. The third semiconductor layer 170 includes a number of spaced protrusions 172. The third semiconductor layer 170 is discontinuous. The second electrode 160 is transparent and covers the entire exposed surface of the second semiconductor layer 140. Furthermore, the second electrode 160 covers the entire surface of the third semiconductor layer 170 and the second carbon nanotube layer 104. The second electrode 160 is transparent and very thin. The second carbon nanotube layer 104 is located between the second electrode 160 and the second semiconductor layer 140. The protrusions 172 are spaced from each other to define a number of openings. The second carbon nanotube layer 104 is located in the openings formed by two adjacent protrusions 172. In one embodiment, a number of gaps are formed between the carbon nanotubes of the second carbon nanotube layer 104 and the protrusions 172, the second carbon nanotube layer 104 permeates the gaps between the second carbon nanotube layer 104 and the protrusions 172 and contacts with the second semiconductor layer 140.

The structure of the LED 50 is similar to the structure of the LED 40. The difference is that a portion of the first carbon nanotube layer 102 is enclosed in the first semiconductor layer 120, a remaining portion of the first carbon nanotube layer 102 is exposed, the second electrode 160 is transparent and covers the entire exposed surface of the second semiconductor layer 140, the second carbon nanotube layer 104 is located in the openings defined by two adjacent protrusions 172, the second carbon nanotube layer 104 is located in the openings formed by two adjacent protrusions 172, and the second electrode 160 is transparent and very thin.

A method for making the LED 50 is similar to the method for making the LED 40. The method for making the LED 50 includes the following steps:

S51, providing a substrate 100 having an epitaxial growth surface;

S52, suspending a first carbon nanotube layer 102 above the epitaxial growth surface;

S53, growing a first semiconductor layer 120, an active layer 130 and a second semiconductor layer 140 on the epitaxial growth surface in that order, wherein the first carbon nanotube layer 102 is enclosed in the first semiconductor layer 120;

S54, placing a second carbon nanotube layer 104 on the surface of the second semiconductor layer 140, wherein the second carbon nanotube layer 104 has a number of apertures;

S55, growing a third semiconductor layer 170 on a surface of the second semiconductor layer 140, wherein the third semiconductor layer 170 grows through the apertures of the second carbon nanotube layer 104;

S56, etching a portion of the third semiconductor layer 170, the second carbon nanotube layer 104, the second semiconductor layer 140, the active layer 108 and a portion of first semiconductor layer 120 to expose a portion of the first carbon nanotube layer 102; and S57, preparing a first electrode 114 on the exposed portion of the first carbon nanotube layer 102 and preparing a second electrode 112 on the second semiconductor layer 140 to cover the entire surface of the third semiconductor layer 170 and the second carbon nanotube layer 104.

The method for making the LED 50 is similar to the method for making the LED 40. The difference is that in step S343 of removing the second carbon nanotube layer can be omitted, in step S55, a portion of first semiconductor layer 120 is etched to expose a portion of the first carbon nanotube layer 102, in step S56, the first electrode 150 is formed on the surface of the exposed first carbon nanotube layer 102, the second electrode 160 covers the entire surface of the third semiconductor layer 170 and the second carbon nanotube layer 104, and the second electrode 160 is transparent and very thin.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a light emitting diode, the method comprising:
providing a substrate having an epitaxial growth surface;
suspending a carbon nanotube layer above the epitaxial growth surface;
growing a first semiconductor layer, an active layer, and a second semiconductor layer on the epitaxial growth surface in that order, wherein the first semiconductor layer comprises a buffer layer, an intrinsic semiconductor layer, and a doped semiconductor layer stacked in that order;

exposing the doped semiconductor layer by removing the substrate, the buffer layer, and the intrinsic semiconductor layer; and preparing a first electrode electrically connected to the first semiconductor layer and a second electrode electrically connected to the second semiconductor layer.

2. The method of claim 1, wherein the carbon nanotube layer is a free-standing structure.

3. The method of claim 1, wherein a distance between the carbon nanotube layer and the epitaxial growth surface is in a range from about 10 nanometers to about 500 micrometers.

4. The method of claim 1, wherein suspending the carbon nanotube layer comprises the following steps: providing a supporting device; fixing the carbon nanotube layer on the supporting device; and suspending the carbon nanotube layer above the epitaxial growth surface by the supporting device.

5. The method of claim 1, wherein the carbon nanotube layer covers the entire epitaxial growth surface.

6. The method of claim 1, wherein the carbon nanotube layer defines a plurality of apertures.

7. The method of claim 1, wherein the carbon nanotube layer comprises a carbon nanotube film or a plurality of carbon nanotube wires substantially parallel to and spaced from each other.

8. The method of claim 7, wherein a plurality of channels is formed in the doped semiconductor layer, the channels are substantially parallel to and spaced from each other, and the carbon nanotube layer is located in the channels.

9. The method of claim 1, wherein the carbon nanotube layer comprises a plurality of stacked carbon nanotube films and a plurality of carbon nanotube wires crossed with each other or woven together to form a carbon nanotube network.

10. The method of claim 9, wherein a channel-network is formed in the doped semiconductor layer, and the carbon nanotube layer is located in the channel-network.

11. The method of claim 6, wherein the doped semiconductor layer grows through the apertures of the carbon nanotube layer, and along a direction substantially parallel to the epitaxial growth surface to connect together and enclose the carbon nanotube layer.

12. The method of claim 11, wherein the doped semiconductor layer further grows after the doped semiconductor layer is enclosing the carbon nanotube layer.

13. The method of claim 1, wherein removing the substrate comprises the following steps: polishing and cleaning the surface of the substrate far away from the first semiconductor layer; locating the substrate on a platform and irradiating the substrate and the first semiconductor layer by a laser; and immersing the substrate into a solvent and removing the substrate.

14. The method of claim 1, wherein the buffer layer is removed in the process of irradiating the substrate by the laser.

15. The method of claim 1, wherein the intrinsic semiconductor layer is removed by etching.

16. The method of claim 1, wherein a portion of the first semiconductor layer is etched after a portion of the second semiconductor layer and the active layer is etched, so that a portion of the carbon nanotube layer is exposed, and the first electrode covers the exposed surface of the carbon nanotube layer.

17. The method of claim 1, wherein the second electrode covers the entire surface of the second semiconductor layer.

* * * * *